United States Patent
Kesterson et al.

(10) Patent No.: US 9,772,367 B2
(45) Date of Patent: Sep. 26, 2017

(54) LOAD CONNECTION DETECTION

(71) Applicant: Dialog Semiconductor Inc., Campbell, CA (US)

(72) Inventors: John William Kesterson, Seaside, CA (US); Yong Li, San Jose, CA (US); Fuqiang Shi, Los Gatos, CA (US)

(73) Assignee: Dialog Semiconductor Inc., Campbell, CA (US)

( * ) Notice: Subject to any disclaimer, the term of this patent is extended or adjusted under 35 U.S.C. 154(b) by 372 days.

(21) Appl. No.: 14/553,740

(22) Filed: Nov. 25, 2014

(65) Prior Publication Data
US 2016/0146877 A1   May 26, 2016

(51) Int. Cl.
H02H 1/00      (2006.01)
G01R 31/04    (2006.01)
G01R 31/02    (2006.01)

(52) U.S. Cl.
CPC .......... G01R 31/043 (2013.01); *G01R 31/025* (2013.01)

(58) Field of Classification Search
CPC ............ G01R 19/0092; G01R 19/0084; G01R 19/165; G01R 19/00; G01R 21/06; G01R 19/145; G01R 17/00; G01R 23/02; G01R 25/00; G01R 25/005
See application file for complete search history.

(56) References Cited

U.S. PATENT DOCUMENTS 7,336,066 B2   2/2008   West
2004/0174074 A1*   9/2004   Ehrlich ................ H01H 47/002
                                                                 307/125
2005/0258818 A1   11/2005   West
2015/0048681 A1*   2/2015   Kwasinski .......... H02M 3/3372
                                                                 307/52

FOREIGN PATENT DOCUMENTS

| DE | 101 46 753 C1 | 4/2003 |
| KR | 20-0204625 | 12/2000 |
| KR | 2002-0042091 | 6/2002 |
| KR | 10-2011-0129475 | 12/2011 |
| KR | 10-1174610 | 8/2012 |

OTHER PUBLICATIONS

German Office Action, German Application No. 10 2015 202 059.2, Oct. 30, 2015, 11 pages (with concise explanation of relevance).
Korean Office Action, Korean Application No. 10-2015-0165292, Jan. 10, 2017, 8 pages (with concise explanation of relevance).

* cited by examiner

*Primary Examiner* — Alesa Allgood
(74) *Attorney, Agent, or Firm* — Fenwick & West LLP

(57) ABSTRACT

An apparatus comprises an output port to be connected to a load; a first input port to receive a first input signal; and a second input port coupled between the first input port and the output port, to receive a second input signal. The apparatus further comprises a coupling circuit to couple the second input signal to the output port and a frequency isolation circuit that has a frequency response to propagate the first input signal to the output port but prevent the second input signal from propagating to the first input port. The apparatus also comprises a detection circuit to determine a voltage of an output signal at the output port, the output signal having a first amplitude range with a load absent at the output port and having a second amplitude range lower than the first amplitude range with the load present at the output port.

17 Claims, 11 Drawing Sheets

LOAD CONNECTION DETECTION

BACKGROUND

1. Technical Field

The present disclosure relates generally to methods and apparatuses for detecting connection of a load device to a source device and, more specifically, to detecting connection of a load device to a power converter.

2. Description of the Related Arts

Various communication protocols rely on communication signaling between mating devices (e.g., source and load devices), for power and data transfer applications. In such cases, it may desirable for the source device to detect whether or not a load device is in fact connected to the source device. For example, if the source device is a regulated power supply that supports various types of load devices or various modes of powering load devices (e.g., variable supply voltages), the source device might need to identify whether or not a load device is connected and optionally the type of load device that is connected to it in order to provide the appropriate level of voltage to safely power the load device. Some newer generation load devices have the capability to identify themselves to the source device by exchanging handshake signals or performing predefined discovery sequences. However, some legacy load devices may not have the capability to perform such discovery.

In such situations, alternative approaches are needed to enable a source device to determine whether or not a load device is connected to it, and optionally, the type of load device that is connected.

SUMMARY

Accordingly, some embodiments provide methods and apparatuses that enable a source device to detect the presence or absence of a load device, and optionally, characteristics of the load device. An apparatus comprises an output port to be connected to a load, a first input port to receive a first input signal, and a second input port coupled between the first input port and the output port, the second input port to receive a second input signal. The apparatus further comprises a coupling circuit to couple the second input signal to the output port. Additionally, the apparatus comprises a frequency isolation circuit coupled between the first input port and the second input port, the frequency isolation circuit having a frequency response to propagate the first input signal to the output port but prevent the second input signal from propagating to the first input port. Furthermore, the apparatus comprises a detection circuit to determine a voltage of an output signal at the output port, the output signal having a first amplitude range with a load absent at the output port and having a second amplitude range lower than the first amplitude range with the load present at the output port.

In one or more embodiments, the coupling circuit includes a transformer. In such embodiments, the second input port is coupled to a primary side of the transformer, and the first input port and the output port are coupled to a secondary side of the transformer. In such embodiments, the frequency isolation circuit includes an inductive element of the transformer.

In one or more embodiments, the coupling circuit includes a capacitor coupling the second input port to the output port. In such embodiments, the frequency isolation circuit is an inductor coupled to the second input port via the coupling circuit.

In one or more embodiments, the first amplitude range is between three and ten times greater than the second amplitude range. In one embodiment, the first input signal is substantially a DC signal, and the second input signal has a frequency not less than 1 MHz. In one embodiment, the second input signal is a bandlimited signal having a plurality of frequencies between 500 kHz and 5 MHz. In one embodiment, the first input signal is a regulated output voltage of a power supply circuit.

In one embodiment, a method comprises receiving a first input signal at a first input port. The method further comprises injecting a second input signal at a second input port, the second input port coupled between the first input port and an output port. The second input signal is prevented, by a frequency isolation circuit, from propagating to the first input port. The method also comprises detecting a voltage of an output signal at the output port responsive to the injected second input signal. The method also comprises, responsive to an amplitude range of the voltage being lower than a threshold amplitude range, determining that a load device is connected at the output port; and responsive to the amplitude range of the voltage being greater than the specified threshold, determining that a load device is not connected at the output port.

In one or more embodiments, the method also comprises detecting a current of the output signal at the output port responsive to the injected second input signal; determining a phase relationship between the current and the voltage of the output signal at the output port; and determining characteristics of the load device based on the phase relationship.

In one or more embodiments, the second input signal comprises a first and a second frequency. In such embodiments, the method additionally comprises determining a first amplitude range of the output signal for the first frequency and a second amplitude range of the output signal for the second frequency; comparing the first amplitude range with a first reference to obtain a first measure of attenuation and the second amplitude range with a second reference to obtain a second measure of attenuation; and determining characteristics of the load device based on a comparison of the first and second measures of attenuation.

The features and advantages described in the specification are not all inclusive and, in particular, many additional features and advantages will be apparent to one of ordinary skill in the art in view of the drawings, specification, and claims. Moreover, it should be noted that the language used in the specification has been principally selected for readability and instructional purposes, and may not have been selected to delineate or circumscribe the inventive subject matter.

BRIEF DESCRIPTION OF THE DRAWINGS

The teachings of the embodiments of the present disclosure can be readily understood by considering the following detailed description in conjunction with the accompanying drawings.

DETAILED DESCRIPTION OF EMBODIMENTS

The figures and the following description relate to preferred embodiments of the present disclosure by way of illustration only. It should be noted that from the following discussion, alternative embodiments of the structures and methods disclosed herein will be readily recognized as viable alternatives that may be employed without departing from the principles of the disclosure.

Reference will now be made in detail to several embodiments of the present disclosure, examples of which are illustrated in the accompanying figures. It is noted that wherever practicable similar or like reference numbers may be used in the figures and may indicate similar or like functionality. The figures depict embodiments of the present disclosure for purposes of illustration only. One skilled in the art will readily recognize from the following description that alternative embodiments of the structures and methods illustrated herein may be employed without departing from the principles of the disclosure described herein.

Inductively Coupled Input Signal Source

Figure 1A:
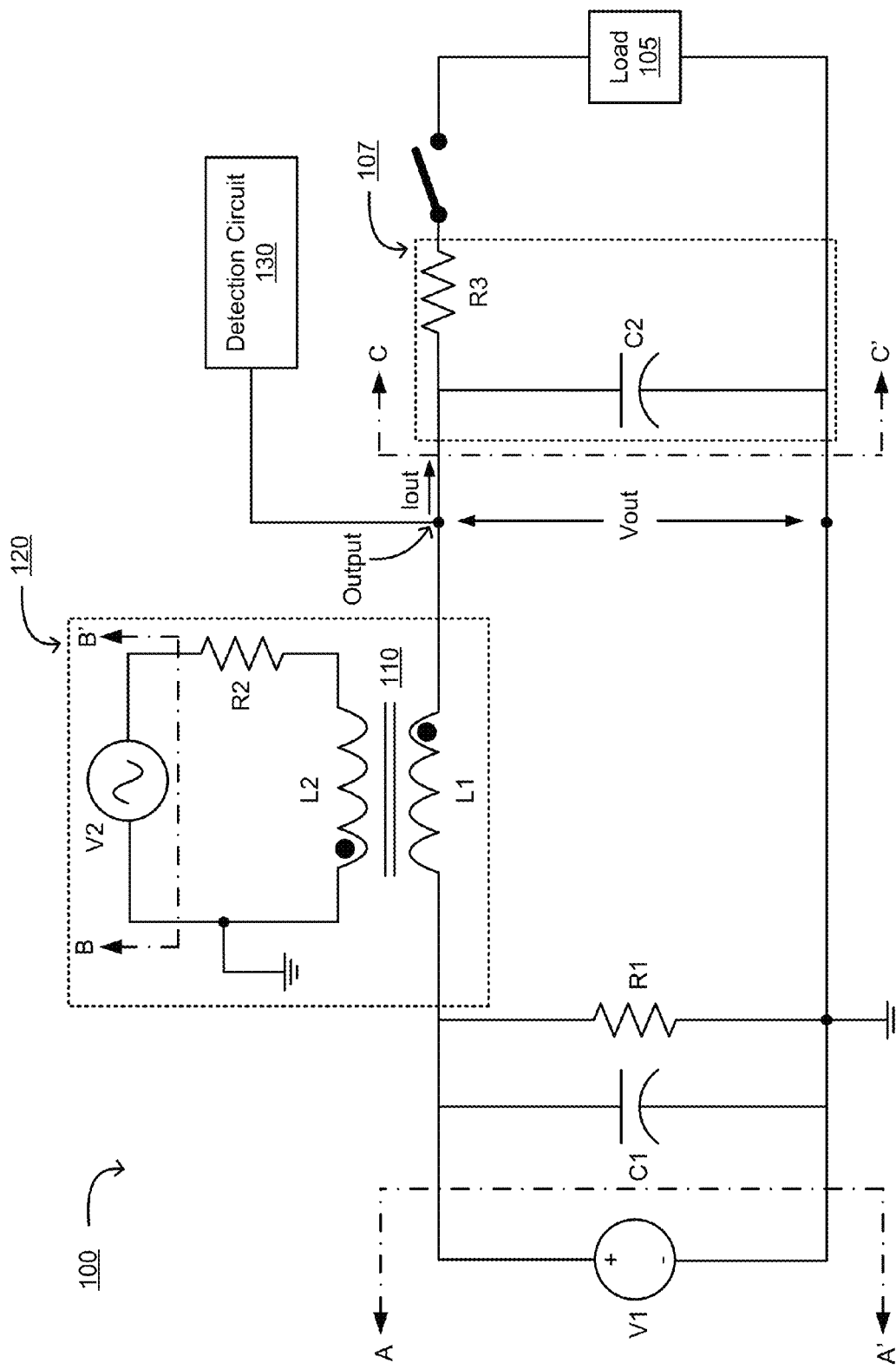
FIG. 1A illustrates a first configuration of an apparatus for detecting a connection of a load device at an output port, according to one embodiment.

FIG. 1A illustrates a first configuration 100 of an apparatus for detecting a connection of a load device at an output port, according to one embodiment.

The apparatus of FIG. 1A may be a component of or may be coupled to a power supply circuit such as a regulated DC power supply, a switching power supply, a power adapter or charger configured to provide a power signal to a load device. For example, the apparatus may be a component of a power output port of a data transfer connector such as a USB connector that includes charging functions. In this example, the apparatus may drive or provide a power signal to the Vbus line of a mating USB cable to power a load device 105 connected to the distal end of the USB cable.

In such embodiments, it is desirable to detect whether or not a load device is connected to the apparatus without the load device identifying itself through a discovery sequence or without exchanging handshake signals with the load device. Additionally, it is desirable to detect the connection or absence of a load device without impacting the operation of the power supply, if connected.

To this end, as shown in FIG. 1A, the first configuration 100 of the apparatus comprises a first input port AA', a second input port BB', and an output port CC'.

The first input port AA' is configured to receive a first input signal V1. In some embodiments, the first input signal is a regulated output voltage of a power supply circuit and is substantially a DC signal. In such embodiments, the first input signal is configured to power a load device (such as a cell phone or mobile device) that couples to the apparatus. The apparatus includes an output port CC' to be connected to a load 105. Load 105 may be connected to the output port CC' of the apparatus through a cable 107, such as a Vbus line of a USB cable. The cable 107 may have a cable capacitance (C2) and cable resistance (R3), as illustrated in FIG. 1A.

The apparatus further includes a second input port BB' coupled between the first input port AA' and the output port CC'. The second input port BB' is configured to receive a second input signal V2. The second input signal is suitably discriminated in frequency from the first input signal and is higher in frequency than the first input signal. In some embodiments, the second input signal is a sinusoidal signal having a frequency between 500 kHz and 5 MHz. For example, in one embodiment the second input signal may be a 1 MHz sinusoidal signal. In other embodiments, the second input signal is a bandlimited signal (e.g., a pseudo random signal, broadband noise signal, a swept sine signal, a PSK or phase shift keyed signal, and the like) having a plurality of frequencies within a specified frequency range (e.g., between 500 kHz and 5 MHz).

The apparatus further includes a coupling circuit 110 to couple the second input signal V2 to the output port CC'. In one embodiment, and as shown in FIG. 1A, the coupling circuit 110 includes a transformer including primary side windings L2 and secondary side windings L1. The second input port BB' is coupled to a primary side L2 of the transformer functioning as the coupling circuit 110; the first input port AA' and the output port CC' are coupled to a secondary side L1 of the transformer functioning as the coupling circuit 110. Primary side voltage (corresponding to the second input signal V2) and resistance R2 are reflected to or coupled to the secondary side L1 of the transformer based on the turns ratio or impedance transform of the transformer as explained further with reference to FIG. 1B. In this embodiment, the second input signal V2 is thus coupled to the output port CC' through the transformer coupling circuit 110.

A frequency isolation circuit is coupled between the first input port AA' and the second input port BB'—the frequency isolation circuit has a frequency response to propagate the first input signal V1 to the output port CC' but prevent the second input signal V2 from propagating to the first input port AA'. In some embodiments, and as illustrated in FIG. 1A, the frequency isolation circuit is formed by an inductive element of the transformer (such as the secondary side winding L1). In such embodiments, the secondary side winding L1 has an inductance of approximately 10-20 μH. A reactance of the inductive element L1 at the frequency of the first input signal (e.g., at DC) is sufficiently low to propagate the first input signal V1 to the output port CC'. But the reactance of the inductive element at the frequency of the second input signal V2 (e.g., at approximately 1 MHz) is sufficiently high to prevent the second input signal V2 from propagating to the first input port AA'. Thus, the second input signal V2 can be coupled to the output port CC' without impacting the operation of a device (such as a regulated power supply) coupled to the first input port AA'.

The apparatus further comprises a detection circuit 130 to detect or determine a voltage (Vout) of an output signal (Output) at the output port CC' and to ascertain whether or not a load is connected to the output port CC' or to the distal end of a cable 107 based on characteristics of the output signal. Typical load devices (such as cell phones, laptops, mobile computing devices) have input impedances (input resistance and capacitance values) within a known range. For example, typical loads have input capacitances that range from 0.1 μF to 100 μF. When coupled to the output port, the load capacitance along with the reflected source resistance, forms a low pass filter pole (as explained further with reference to FIG. 1C and FIG. 5 below). If the frequency of the second input signal V2 is selected to be sufficiently greater than the frequency of the pole, then the second input signal V2 is suitably attenuated by the filter response upon connection of the load. Absent the load, the second input signal is not attenuated. Thus, different amplitude ranges of the voltages of the resulting output signal result from the presence or absence of the load.

Figure 4:
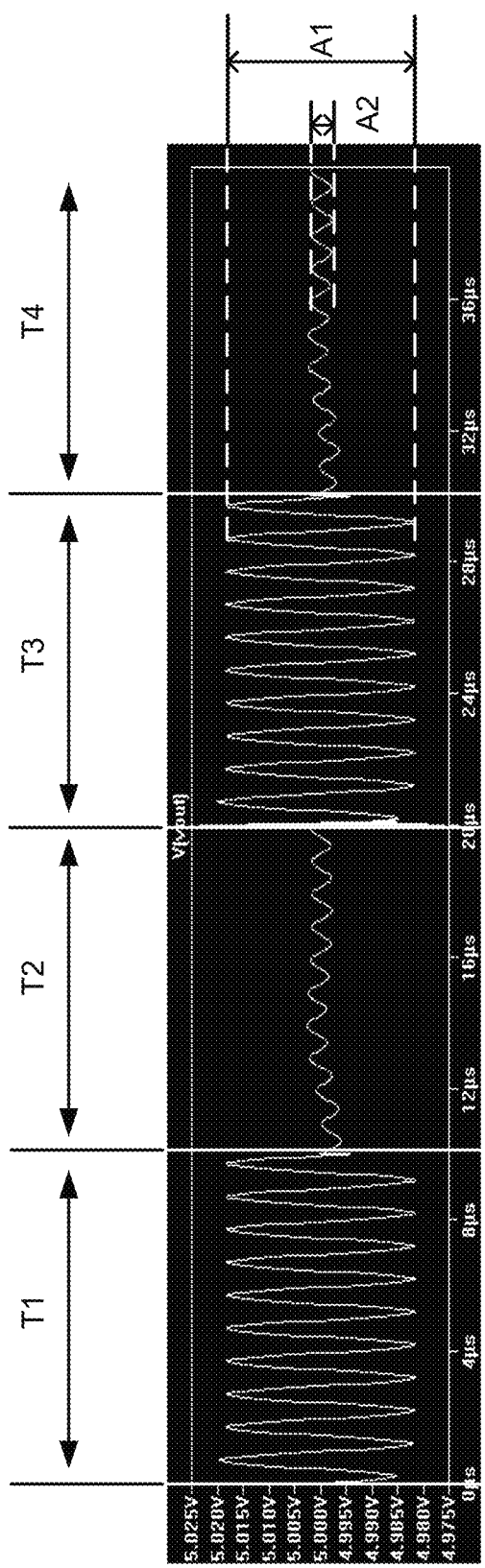
FIG. 4 illustrates a simulation of a voltage-time waveform measured at the output port of the apparatus of FIG. 1A or 2A, the waveform generated responsive to an alternating connection and removal of the load, according to one embodiment.

In other words, the output signal has a first amplitude range (A1, as shown in FIG. 4) with a load absent at the output port CC' and has a second amplitude range (A2, as shown in FIG. 4) lower than the first amplitude range with the load present at the output port CC'. The detection circuit 130 can measure the amplitude range of the output voltage and ascertain whether or not a load is connected to the output port. Circuit 130 can detect the AC component magnitude to determine whether the load is present or not. In one embodiment, the detection circuit 130 includes a peak detector, a threshold detector, a comparator, an instrumentation amplifier, a multimeter, a voltmeter, and/or any other suitable component that measures and optionally compares the output voltage or the amplitude range of the output voltage to a threshold or reference value.

Additionally, the detection circuit 130 may also determine a current (Iout) of the output signal at the output port (Output) corresponding to the second input signal V2 and a phase relationship between the voltage (Vout) and the current (Iout) of the output signal corresponding to the second input signal V2. In one embodiment, the detection circuit 130 includes a current meter (ammeter), a multimeter, a transimpedance amplifier, a spectrum analyzer, an oscilloscope, and/or any other suitable component capable of measuring current, voltage, and a phase relationship between the measured current and voltage. A phase relationship between the voltage and current of the output signal depends on component values of the load 105. The detection circuit 130 may determine or compute characteristics (component values, impedance, and so on) of the load based on the measured phase relationship. For example, for a purely resistive load, the voltage and current of the output signal would be in phase or substantially in phase; for a purely capacitive load, voltage and current of the output signal would be out-of-phase with the current leading the voltage by a phase of substantially 90°; for a load having both resistive and capacitive components, the current of the output signal leads the voltage of the output signal by a value between 0 and 90° depending on relative values of the resistive and capacitive components.

In such embodiments, the detection circuit 130 uses a combination of the phase relationship between the current and voltage of the output signal and a measure of attenuation of the voltage of the output signal in order to determine characteristics of the load device, if one is determined to be connected. For example, for a resistive short, the detection circuit 130 would detect that the current and voltage are in phase, and determine the resistance of the load (e.g., full short, half short, soft short) based on a value by which the output signal is attenuated. As another example, for a capacitive short, the current and voltage would be out of phase, and the extent of attenuation may be used to determine the capacitance of the load.

Alternatively, or in addition, if the second input signal is a bandlimited signal (e.g., a pseudo random signal, broadband noise signal, a swept sine signal, a PSK or phase shift keyed signal, and the like) having a plurality of frequencies within a specified frequency range (e.g., between 500 kHz and 5 MHz), the detection circuit may further determine amplitude ranges for each of the plurality of frequencies constituting the second input signal. Since a capacitive load would attenuate different frequencies by different extents, in such embodiments, the detection circuit 130 may compare the relative attenuation (e.g., changes in the amplitude ranges relative to known reference amplitude ranges with the load disconnected) across the different frequencies to determine a value of the load capacitance.

The frequency isolation circuit further isolates a source (e.g., a regulated power supply) coupled to the first input port AA' from impacting a signal path of the second input signal V2. Thus, since the isolating component substantially decouples the first input port AA' from the signal path of the second input signal V2, an amplitude or an amplitude range of the output signal (Output) is substantially invariant of characteristics of a source device coupled to the first input port AA'. In other words, presence of a source device at the first input port AA' can be neglected for purposes of analyzing a signal path of the second input signal V2.

Figure 1B:
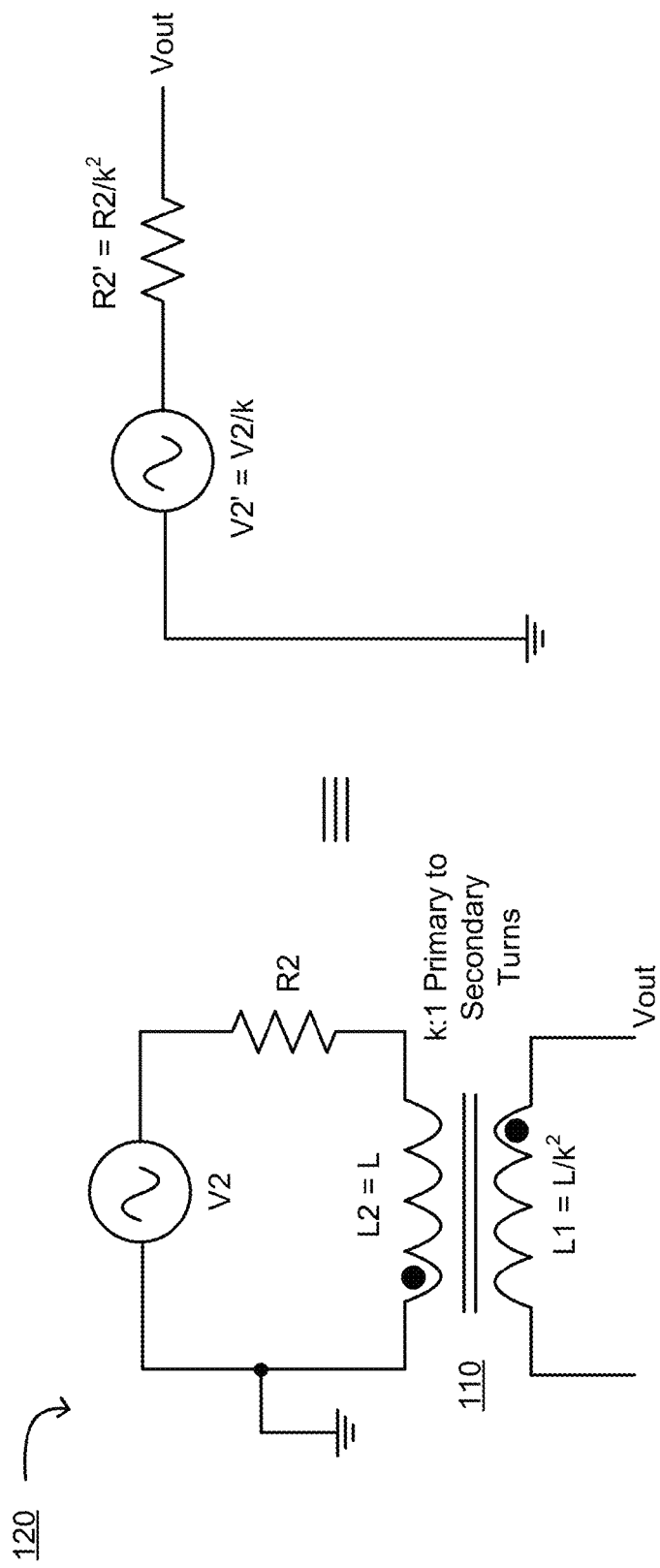
FIG. 1B illustrates equivalent representations of subcomponents of the first configuration of FIG. 1A, according to one embodiment.

FIG. 1B illustrates equivalent representations of subcomponents 120 of the first configuration 100 of FIG. 1A, according to one embodiment.

As shown in FIG. 1B, the coupling circuit (transformer) 110 of the first configuration 100 has a k:1 turns ratio between the primary side (L2) and the secondary side (L1)—an inductance of the primary winding (L2) being L and an inductance of the secondary winding (L1) being k*L. The inductance of the secondary winding (L1) is selected to have an appropriately large value (such as 10-20 μH) so that the reactance of the secondary winding at a frequency of the second input signal V2 is sufficiently large to attenuate the second input signal V2 from propagating to the first input port AA'. Therefore, in the equivalent circuit representation for the second input signal V2, the inductor L1 as well as components connected between the inductor L1 and the first input port AA' can be ignored, as illustrated in FIG. 1B.

Furthermore, based on the primary to secondary turns ratio of the transformer being k:1, the second input signal V2 when reflected to the secondary side L1 is given as:

$$V2'=V2/k \quad (1)$$

Similarly, the primary side resistance R2 when reflected to the secondary side is given as:

$$R2'=R2/k^2 \quad (2)$$

Figure 1C:
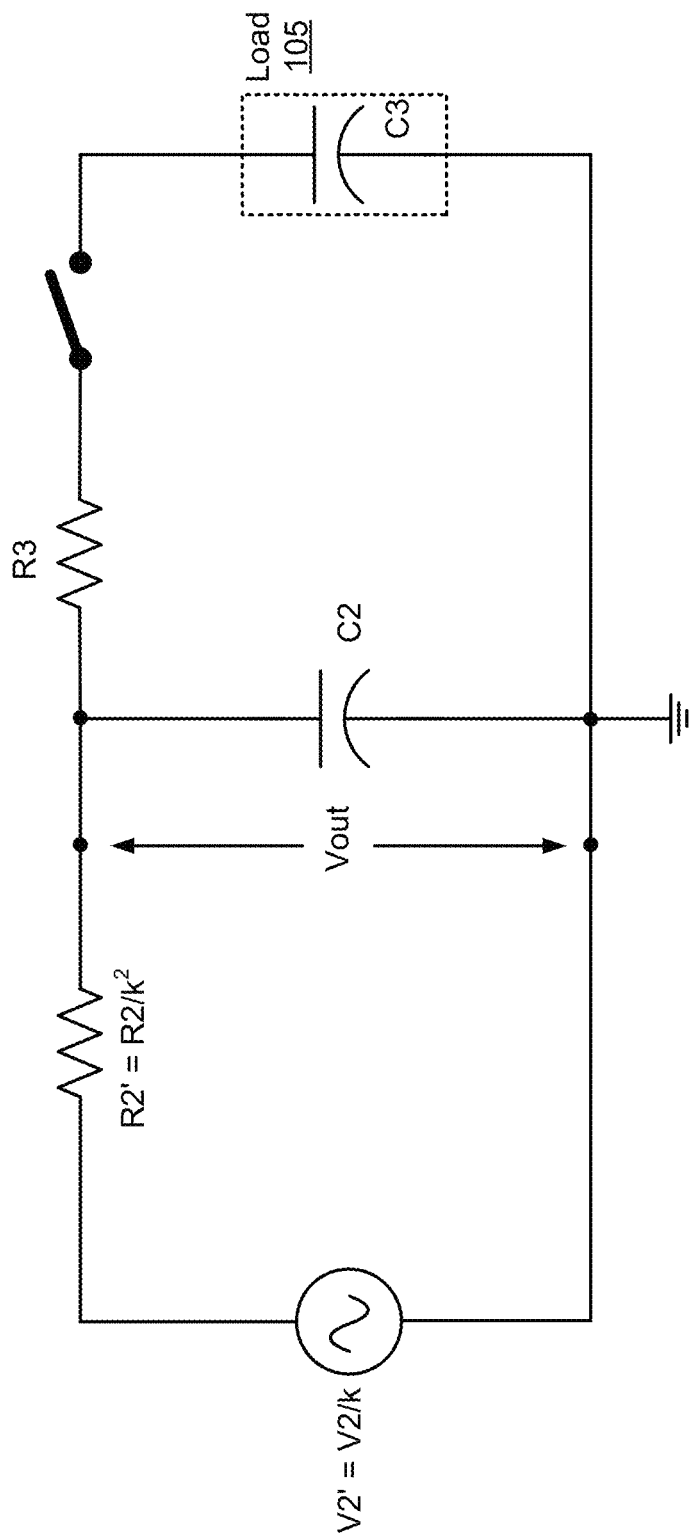
FIG. 1C illustrates an alternative representation of the first configuration of FIG. 1A, according to one embodiment.

FIG. 1C illustrates an equivalent representation of the first configuration 100 of FIG. 1A for the second input signal path with the equivalent circuit of sub-components 120 (shown in FIG. 1B), according to one embodiment.

As explained above with reference to FIGS. 1A and 1B, the isolating component L1 isolates the first input signal source V1 from impacting a signal path of the second input signal V2 by presenting a high impedance to the second input signal. Thus, the first input source V1 is eliminated when considering an equivalent circuit representation of a signal path for the second input signal. Also, as explained with reference to FIG. 1B, V2' is the second input signal reflected to the secondary side of transformer 110. R2' is the primary side resistance R2 reflected to the secondary side of transformer 110.

The transfer function G(s) computed for the output signal (Vout) with respect to the second input (V2') is mathematically described in equation 3 below:

$$G(s) = \frac{\left(R3 + \frac{1}{s \cdot C3}\right) \cdot \frac{1}{s \cdot C2}}{R3 + \frac{1}{s \cdot C3} + \frac{1}{s \cdot C2}} \bigg/ \left[R2' + \frac{\left(R3 + \frac{1}{s \cdot C3}\right) \cdot \frac{1}{s \cdot C2}}{R3 + \frac{1}{s \cdot C3} + \frac{1}{s \cdot C2}}\right] \quad (3)$$

Equation (3) can be simplified to equation (4) below:

$$G(s) = \frac{\frac{1}{R2' \cdot C2} \cdot \left(s + \frac{1}{C3 \cdot R3}\right)}{s^2 + s \cdot \left(\frac{1}{R3 \cdot C3} + \frac{1}{C2 \cdot R3} + \frac{1}{C2 \cdot R2'}\right) + \frac{1}{(C2 \cdot C3 \cdot R2' \cdot R3)}} \quad (4)$$

The transfer function G(s) is characterized by two poles and one zero. The first pole is formed on account of components R2' and C3, the second pole on account of components R2' and C2, and the zero is formed due to components R3 and C3.

The transfer function G2(s) computed for the second output signal (Vout) with respect to the second input (V2') may be simplified or approximated mathematically as described in equation (5) below, which is characterized by a single pole is formed on account of components R2' and C3.

$$G2(s) = \frac{\frac{1}{R2' \cdot C3}}{\left(s + \frac{1}{R2' \cdot C3}\right)} \quad (5)$$

Figure 5:
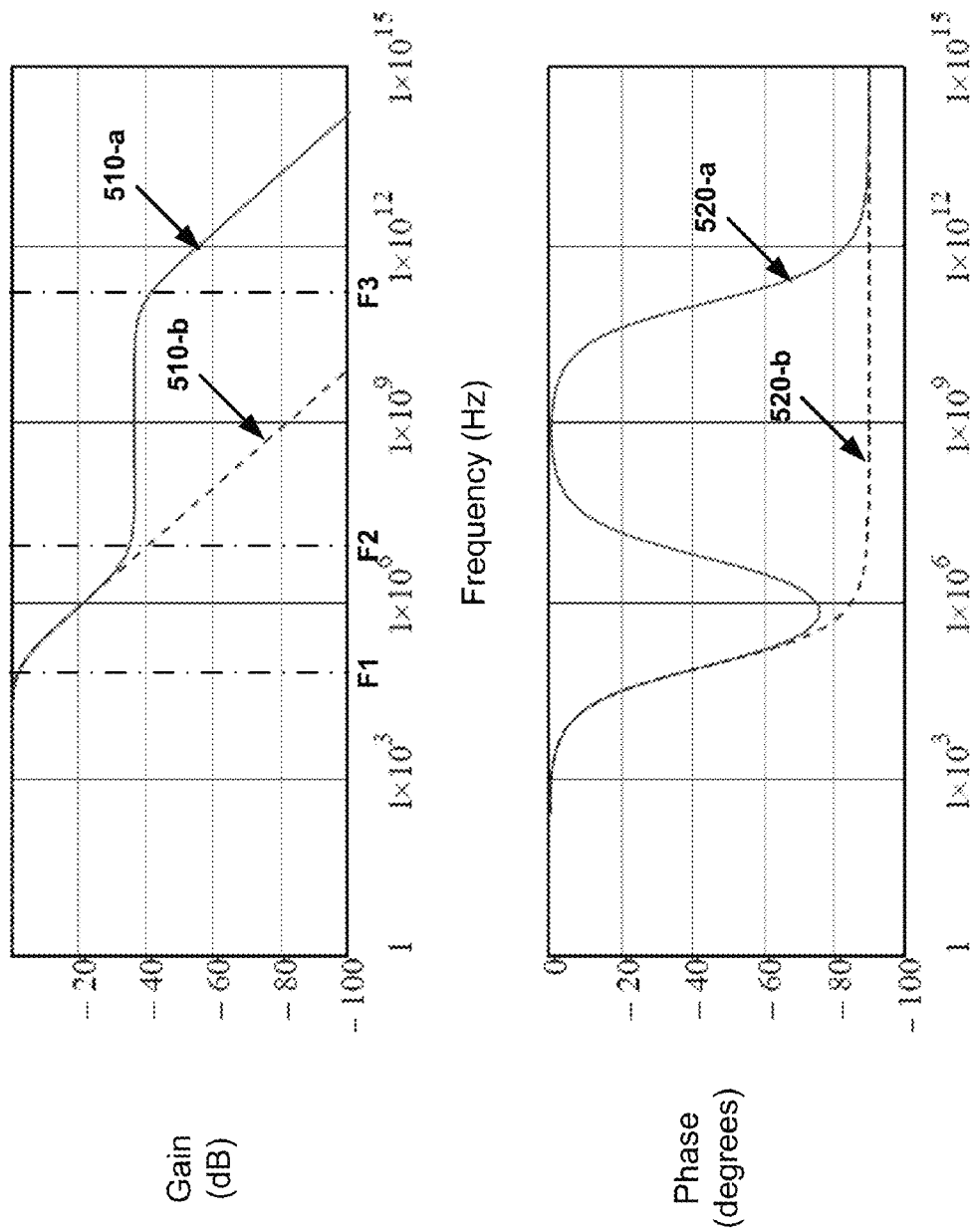
FIG. 5 illustrates frequency response plots (magnitude and phase responses) of a transfer function of the first configuration (FIG. 1A) when connected to a capacitive load, as a function of frequency of the injected input signal, according to one embodiment.

Frequency responses (magnitude and phase responses) of the transfer functions G(s) and G2(s) are illustrated and explained further with reference to FIG. 5.

Capacitively Coupled Input Signal Source

Figure 2A:
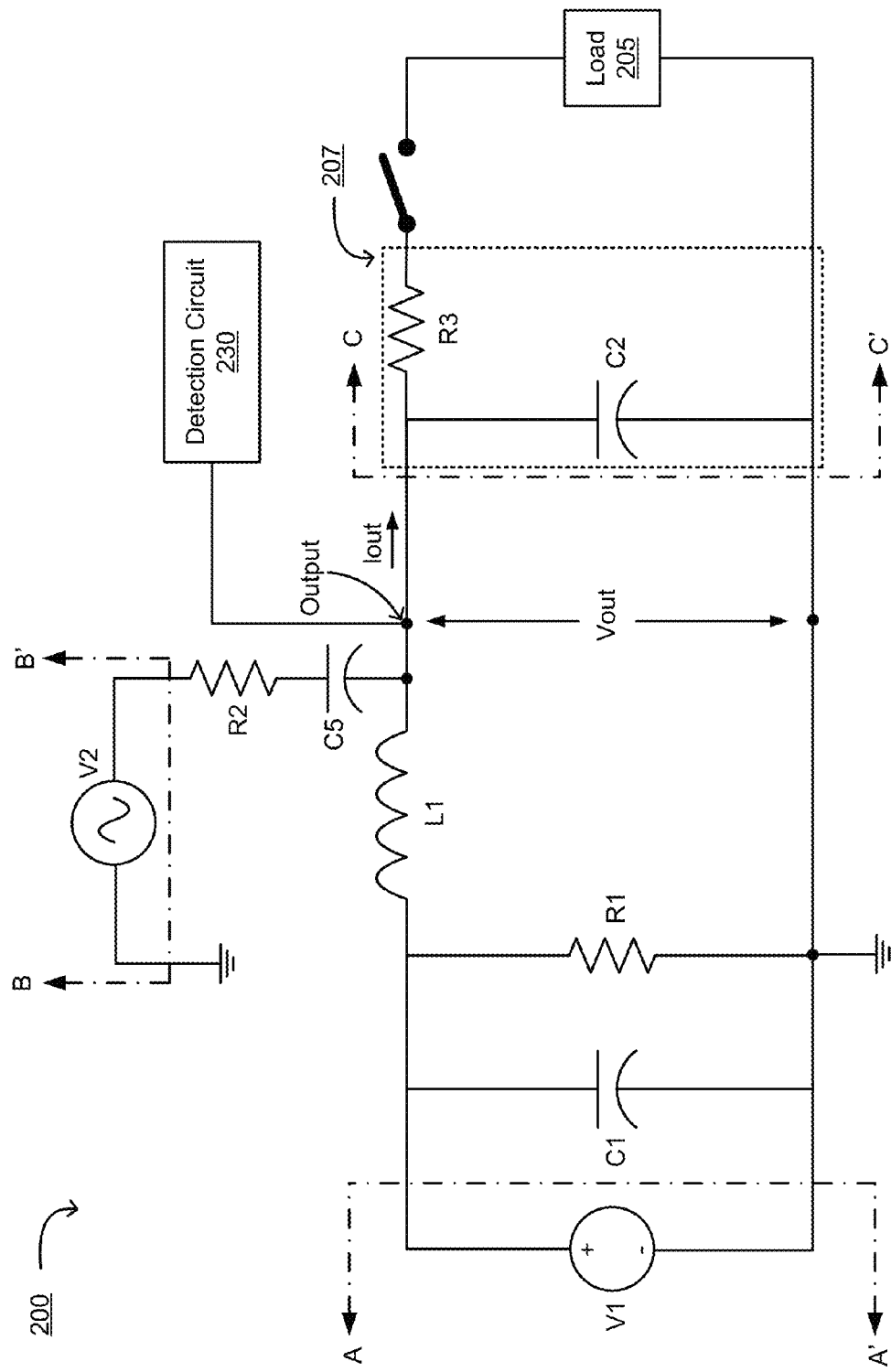
FIG. 2A illustrates a second configuration of an apparatus for detecting a connection of a load device at an output port, according to another embodiment.

FIG. 2A illustrates a second configuration 200 of an apparatus for detecting a connection of a load device at an output port, according to one embodiment.

As shown in FIG. 2A, the second configuration 200 of the apparatus comprises a first input port AA', a second input port BB', and an output port CC'.

Configuration 200 may share various attributes with configuration 100. For example, configuration 200 includes a first input port AA' to receive a first input signal (V1), an output port CC' to be connected to a load (e.g., load 205), a second input port BB' coupled between the first input port AA' and the output port CC' to receive a second input signal (V2). Load 205 may be connected to the output CC' through a cable 207 (such as a Vbus line of a USB cable). The cable 207 may have a capacitance (C2) and resistance (R3).

Configuration 200 of FIG. 2A also includes a coupling circuit to couple the second input signal (V2) to the output port CC'. But a distinction between configuration 100 of FIG. 1A and configuration 200 of FIG. 2A is that the coupling circuit of FIG. 2A that couples the second input signal (V2) to the output port CC' is a capacitor (e.g., capacitor C5 shown in FIG. 2A).

Furthermore, configuration 200 of FIG. 2A also includes frequency isolation circuit coupled between the first input port AA' and the second input port BB', the frequency isolation circuit having a frequency response to propagate the first input signal (V1) to the output port CC' but prevent the second input signal (V2) from propagating to the first input port AA'. In configuration 200 of FIG. 2A, inductor L1 forms the frequency isolation circuit. An inductive reactance of the inductor L1 at a frequency of the second input signal V2 is sufficiently high to block or attenuate the second input signal V2 from propagating to the first input port AA'. But the inductive reactance of the inductor L1 at a frequency of the first input signal V1 is sufficiently low to propagate or pass the first input signal to the output port CC'.

A detection circuit 230 is provided to detect or determine a voltage (Vout) of an output signal at the output port CC', the output signal having a first amplitude range with a load absent at the output port and having a second amplitude range lower than the first amplitude range with the load present at the output port as explained with reference to FIG. 4.

Figure 2B:
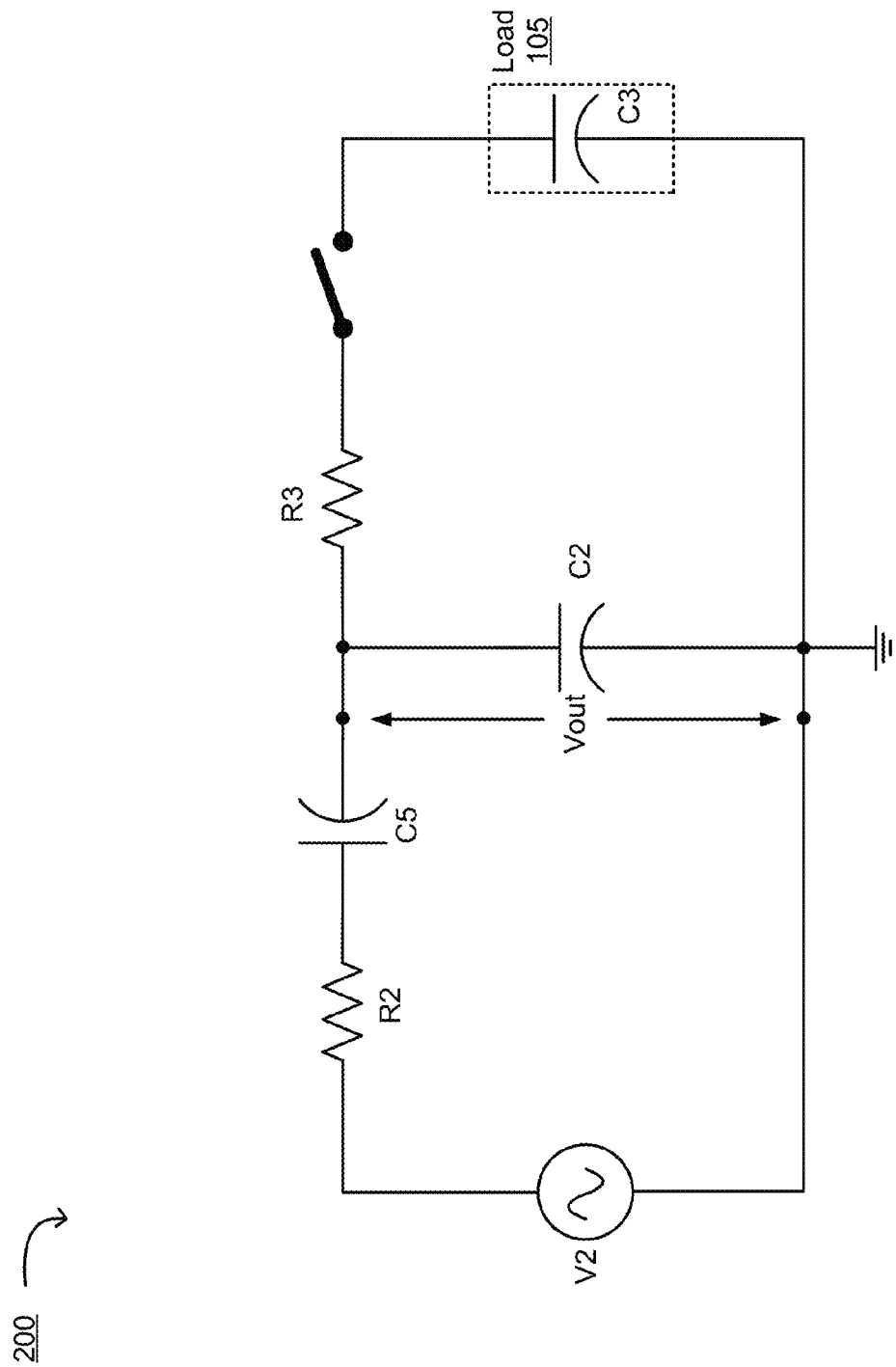
FIG. 2B illustrates an alternative representation of the second configuration of FIG. 2A, according to another embodiment.

FIG. 2B illustrates an equivalent representation of the second configuration of FIG. 2A for the second input signal, according to one embodiment.

The transfer function G3(s) computed for the equivalent circuit of FIG. 2A for the output signal Vout with respect to the second input (V2) is mathematically described below:

$$G3(s) = \frac{\left(R3 + \frac{1}{s \cdot C3}\right) \cdot \frac{1}{s \cdot C2}}{R3 + \frac{1}{s \cdot C3} + \frac{1}{s \cdot C2}} \bigg/ \left[R2 + \frac{1}{s \cdot C5} + \frac{\left(R3 + \frac{1}{s \cdot C3}\right) \cdot \frac{1}{s \cdot C2}}{R3 + \frac{1}{s \cdot C3} + \frac{1}{s \cdot C2}}\right] \quad (6)$$

Equation (6) can be simplified to equation (7) below:

$$G3(s) = \frac{\frac{1}{C2 \cdot R2} \cdot \left(s + \frac{1}{R3 \cdot C3}\right)}{s^2 + s \cdot \left(\frac{\frac{1}{C5 \cdot R2} + \frac{1}{C5 \cdot R2} +}{\frac{1}{C3 \cdot R3} + \frac{1}{C2 \cdot R3}}\right) + \left(\frac{C2 + C3 + C5}{C2 \cdot C3 \cdot C5 \cdot R2 \cdot R3}\right)} \quad (7)$$

The transfer function G3(s) is characterized by two poles and one zero. The first pole is formed on account of components R2 and C3, the second pole on account of components R2 and C2, and the zero is formed due to components R3 and C3.

Figure 6:
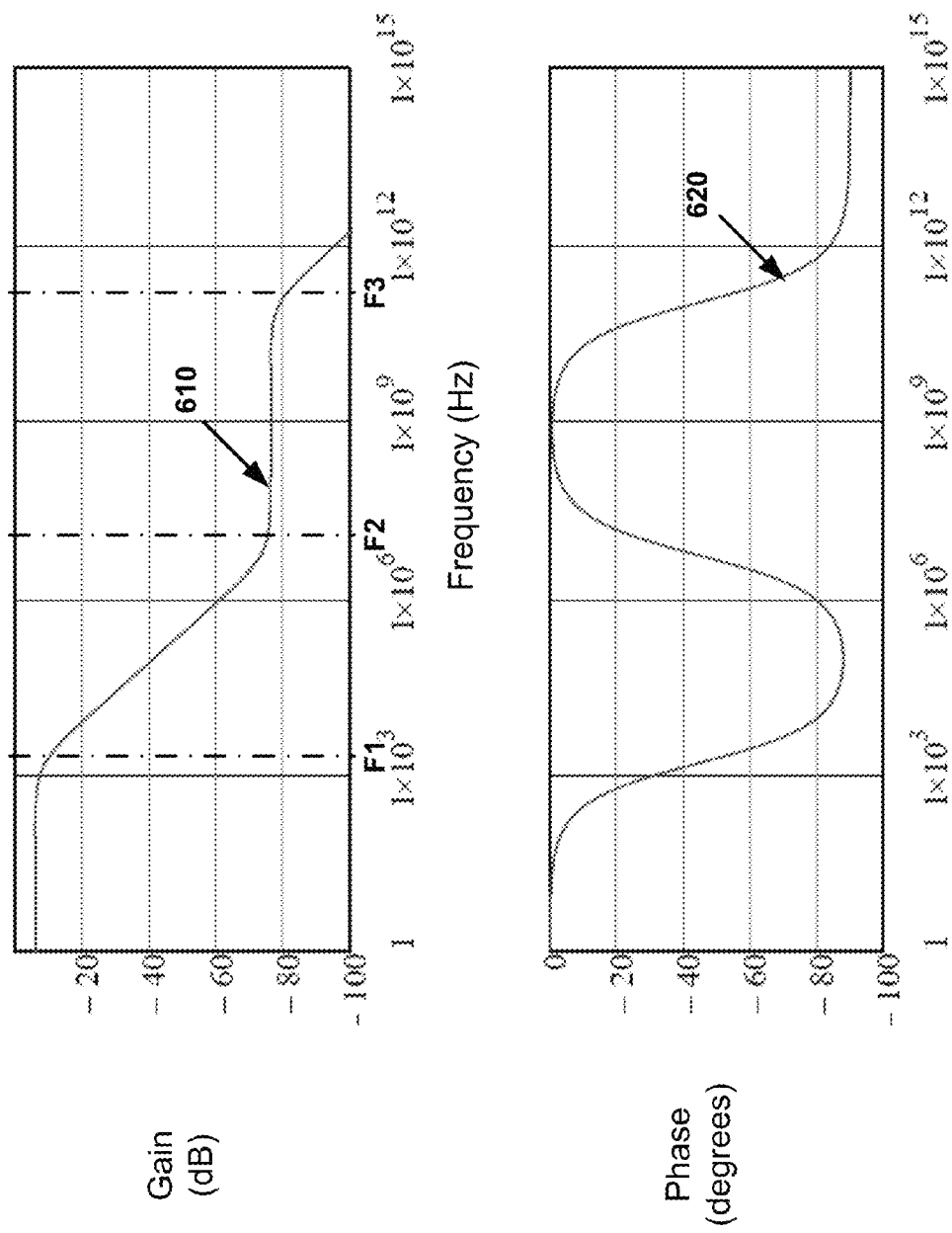
FIG. 6 illustrates frequency response plots (magnitude and phase responses) of a transfer function of the second configuration (FIG. 2A) when connected to a capacitive load, as a function of frequency of the injected input signal, according to one embodiment.

The frequency response (magnitude and phase responses) of the transfer functions $G3(s)$ is illustrated and explained further with reference to FIG. 6.

The analysis above assumes that the inductor L1 is suitably high and therefore substantially completely isolate the second input (V2) from propagating to the first input port AA' and isolates or prevents a source device (or any characteristics of the source device, such as output impedance) coupled to the first input port AA' from impacting the second output signal V2. However, in practice, that may not be the case. In such circumstances, the effect of L1 on the transfer function $G4(s)$ is mathematically illustrated in equation 8 below, where $G4(s)$ is computed for the circuit of FIG. 2A for the output signal Vout with respect to the second input (V2) with L considered:

$$G4(s) = \frac{\left(R3 + \frac{1}{s \cdot C3}\right) \cdot \frac{L1 \cdot s}{C2 \cdot L1 \cdot s^2 + 1}}{R2 + \frac{1}{s \cdot C5} + \frac{\left(R3 + \frac{1}{s \cdot C3}\right) \cdot \frac{L1 \cdot s}{C2 \cdot L1 \cdot s^2 + 1}}{R3 + \frac{1}{s \cdot C3} + \frac{L1 \cdot s}{C2 \cdot L1 \cdot s^2 + 1}}} \quad (8)$$

Figure 7A:
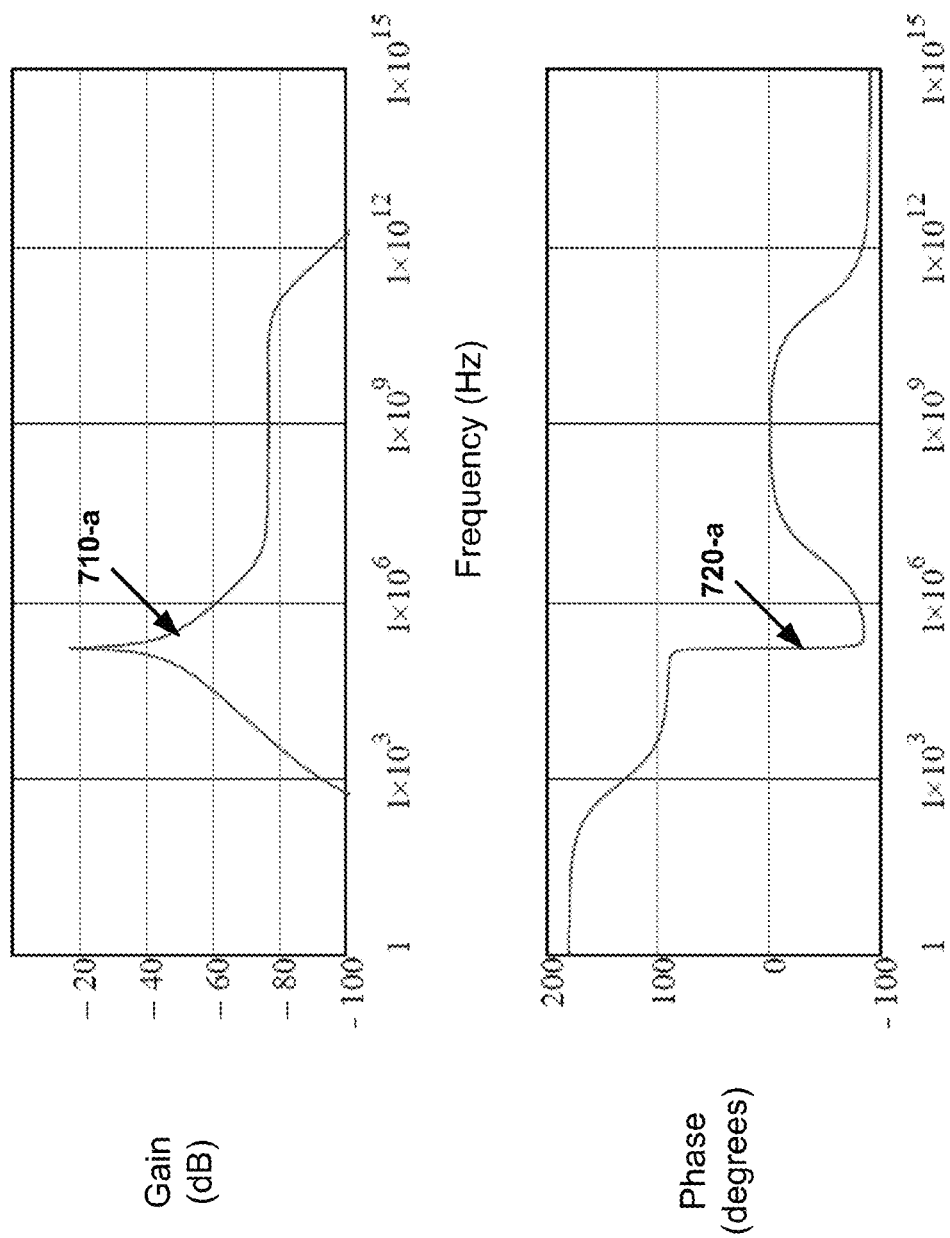
FIGS. 7A and 7B illustrate alternative representations of frequency responses (magnitude and phase responses) of a transfer function of the second configuration (FIG. 2A) with and without a load, respectively, as a function of frequency of the injected input signal, according to another embodiment.
Figure 7B:
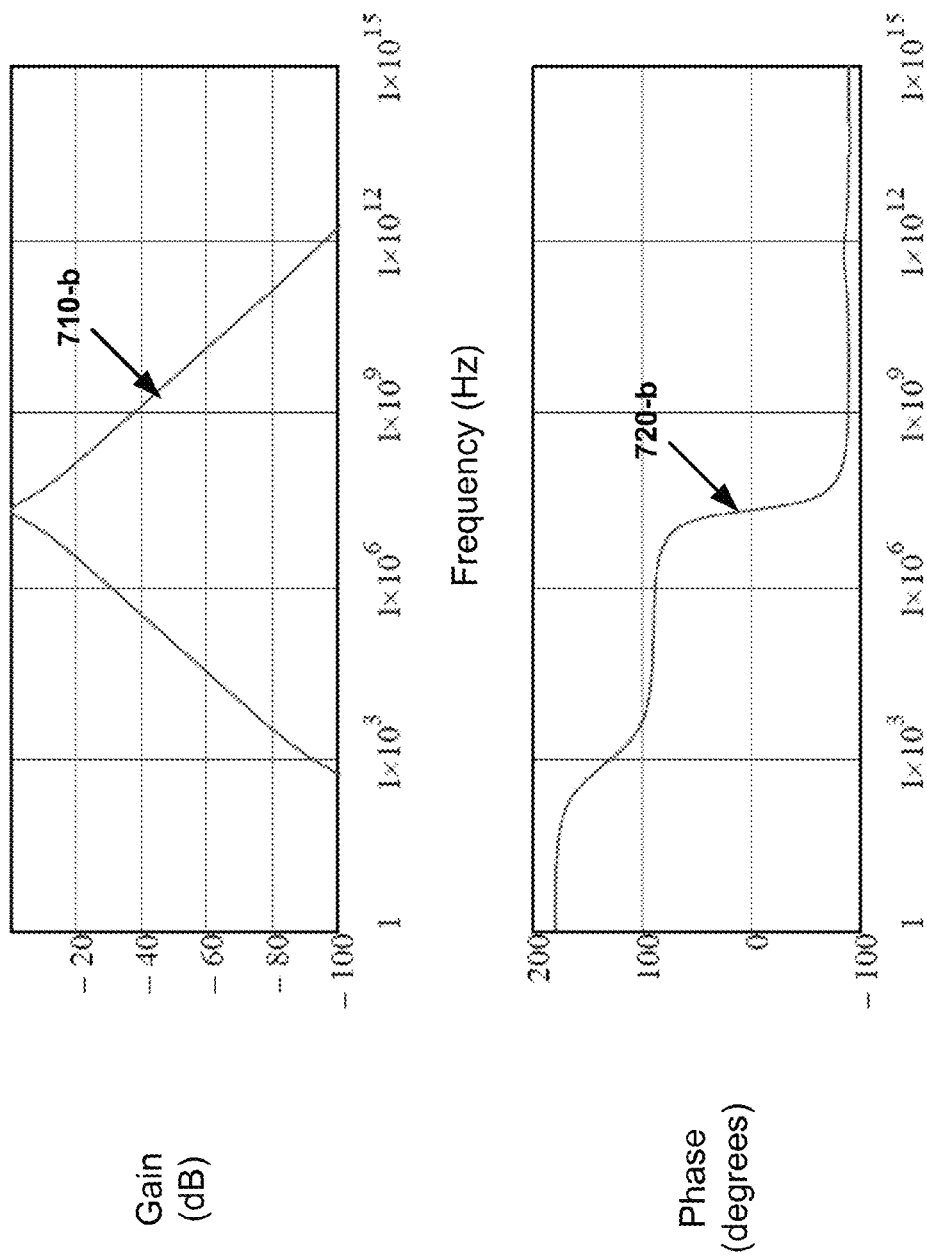

The transfer function $G4(s)$ represents a resonant circuit. FIGS. 7A and 7B illustrate the frequency response (magnitude and phase) of the transfer function $G4(s)$ for configuration 200 with (FIG. 7A) and without (FIG. 7B) load capacitance C3 being connected.

Figure 3:
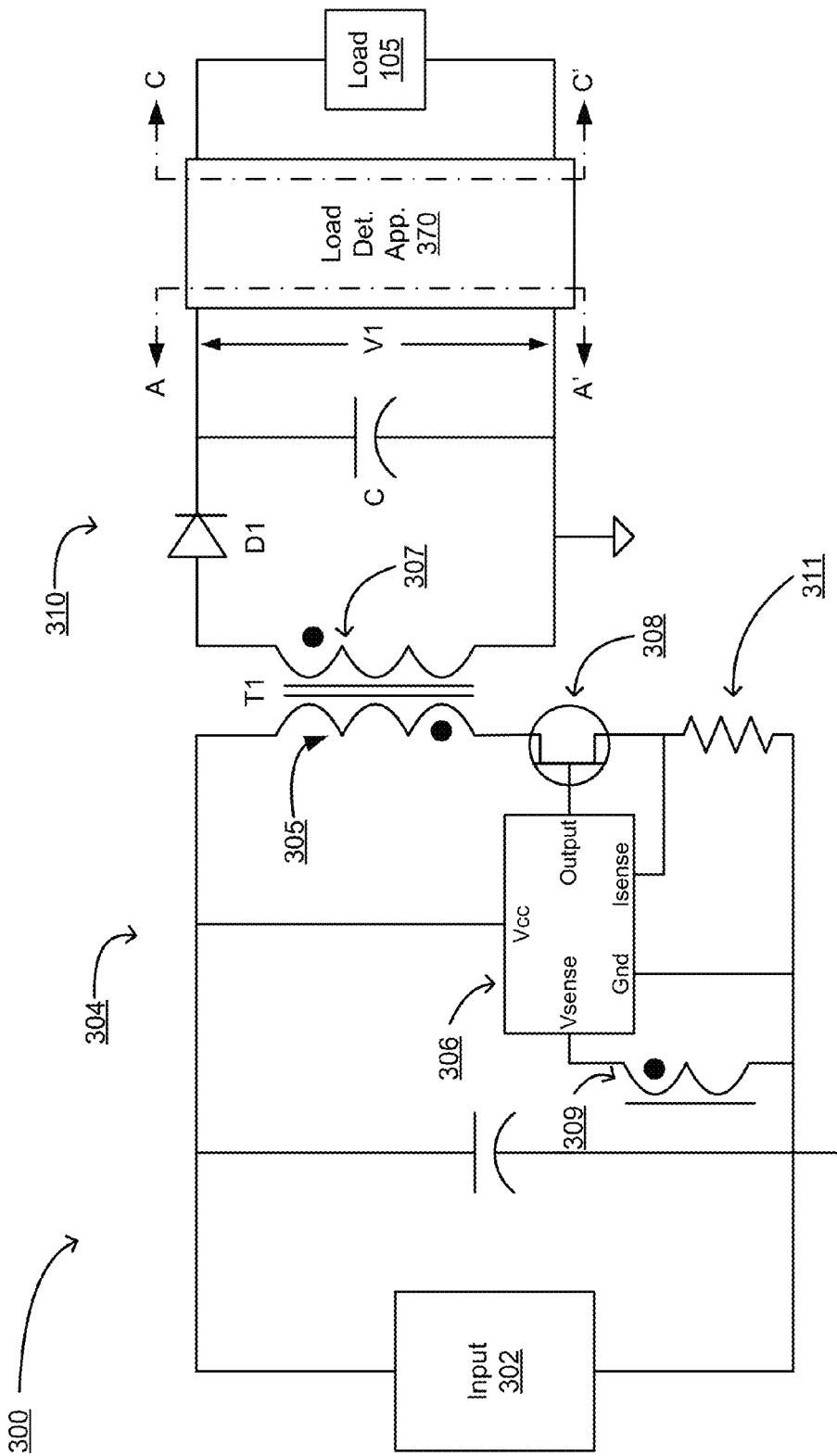
FIG. 3 illustrates an example application of the load detection apparatus (FIG. 1A or FIG. 2A) in a power converter, according to one embodiment.

FIG. 3 illustrates an example application of the load detection apparatus (of FIG. 1A or FIG. 2A) in a power converter 300, according to one embodiment.

The power converter 300 is illustrated in FIG. 3 as an AC to DC flyback switch-mode power supply, but other topologies of power converters can be designed in accordance with the load detection apparatus and other teachings described herein. The power converter 300 includes three principal sections, i.e., an input stage 302, a power stage 304, and a secondary stage 310.

The input stage 302 provides an input voltage to the power stage 304. In one embodiment, the input stage 302 includes a bridge rectifier (not shown) connected to an AC voltage source (not shown) and outputs a rectified but unregulated DC input voltage. The input voltage is applied to the supply voltage pin Vcc of the controller 306 and to the primary winding of power transformer T1.

The power stage 304 comprises power transformer T1, a controller 306, and a switch 308. The power transformer T1 includes a primary winding 305, a secondary winding 307, and an auxiliary winding 309. The controller 306 maintains output regulation via control of the ON and OFF states of power switch 308 via a control signal output from the OUTPUT pin of controller 306. The controller 306 can employ any one of a number of well known modulation techniques, such as pulse-width-modulation (PWM) or pulse-frequency-modulation (PFM), and/or their combinations, to control the ON and OFF states and duty cycles of power switch 308. In one embodiment, the controller 306 is an application-specific integrated circuit (ASIC).

The control signal generated by the controller 306 (e.g., at the Output pin) drives a control terminal of the power switch 308 (alternatively referred to herein as switch 308). As illustrated in FIG. 3, the switch 308 in this example is an n-type metal-oxide-semiconductor field-effect transistor (alternatively referred to herein as a MOSFET), so the control terminal is the gate (G) terminal of the switch 308. The drain (D) of the switch 308 is connected in series with the primary winding 305, and the source (S) of switch 308 is connected to the $I_{SENSE}$ pin of controller 306 and to ground via a sense resistor 311. In other embodiments, the switch 308 can be another type of transistor such as a bipolar junction transistor (BJT) or any other device capable of opening or closing a circuit in a controlled manner. The ground pin (Gnd) of the controller 306 is connected to ground.

The $I_{SENSE}$ pin senses a primary-side current flowing through the primary winding 305 and switch 308 in the form of an analog voltage across sense resistor 311. In some embodiments, sensing the primary-side current of the flyback switching power at the $I_{SENSE}$ pin of the converter 306 allows for cycle-by-cycle peak current control as well as precise constant current control for output current through the load.

The secondary stage 310 of the power converter 300 includes the secondary winding 307, a diode D1. The diode D1 functions as an output rectifier. In some embodiments, a capacitor C is provided at the output of the power converter and functions as an output filter. The resulting regulated voltage (V1) is delivered to the load 105.

To detect whether or not the load 105 is connected to the power converter 300, load detection apparatus 370 is coupled to the secondary stage 310 of the power converter 300 as shown in FIG. 3. The load detection apparatus 370 could be configured as the first configuration 100 described with reference to FIG. 1A or as the second configuration 200 described with reference to FIG. 2A. The first input port AA' of the load detection apparatus 370 couples to the secondary stage 310 of the power converter and the load 105 can connect to the output port CC' of the load detection apparatus 370.

In some embodiments, and as illustrated in FIG. 3, the power converter 300 uses primary side sensing to estimate the voltage across the load 105. For example, the output voltage across the secondary winding 307 is reflected by the voltage across an auxiliary winding 309, which is input to the $V_{SENSE}$ pin of controller 306. This reflected voltage is used as a surrogate or proxy for the voltage across the load. Thus, the output voltage (Vout) generated at the output port CC' as described with reference to FIGS. 1A and 2A may be sensed on the primary side via input to the $V_{SENSE}$ pin of controller 306, as reflected by the voltage across an auxiliary winding 309. In such embodiments, the detection circuit 130 of FIG. 1A or detection circuit 230 of FIG. 2A may be provided within controller 306 or may otherwise be provided on the primary or the auxiliary side of the of the power converter 300.

Typically, in such embodiments, the voltage at the $V_{SENSE}$ pin also provides feedback to the controller 306 indicating the voltage on the secondary winding 307 for use in controlling the operation of switch 308. Sensing the output voltage (e.g., voltage across the load) as reflected across the auxiliary winding 309 at the $V_{SENSE}$ pin allows for precise output voltage regulation while maintaining electrical isolation between the primary and secondary sides of transformer T1.

FIG. 4 illustrates a simulated voltage-time waveform measured at the output port CC' of the apparatus of FIG. 1A or 2A, the waveform generated responsive to an alternating connection and removal of the load, according to one embodiment.

For example, the load is disconnected from the apparatus during the time intervals T1 and T3 resulting in voltage of the output signal having a first amplitude range (A1). During the time intervals T2 and T4, the load is connected to the apparatus, resulting in the voltage of the output signal having a second amplitude range (A2). The second amplitude range (A2) is lower than the first amplitude range (A1) by an index of discrimination that depends on a variety of factors including characteristics (e.g., component values) of the load and a frequency of the second input signal. For a specified range of load component values, a frequency of the second input signal is selected to ensure that the index of discrimination between the second amplitude range and the first amplitude range be greater than a desired discrimination threshold. For a typical capacitive load in the range of 0.1 μF to 100 μF, a frequency of the second input signal V2 may be selected so that the first amplitude range A1 is between three and ten times greater than the second amplitude range A2. In some embodiments, the frequency of the second input signal V2 is selected to have a value between 500 kHz and 5 MHz. For example, the second input signal V2 is a 1 MHz sinusoidal signal.

Furthermore, since commonly used load devices have input load capacitances that, when connected to the output port CC', attenuate the second output signal by a suitably high index of discrimination, the second output signal is attenuated from propagating into the load device (e.g., into a cell phone connected to the apparatus via a USB cable, for charging purposes). But the first input signal (V1) is commonly a regulated DC output voltage of a power supply circuit (as described with reference to FIG. 3). Therefore, the DC regulated signal generated at the output port CC' corresponding to the first input signal is substantially unaltered by the connection of the load or by characteristics of the load. Thus, the load can be powered by the DC regulated signal without being affected by the second output signal.

FIG. 5 illustrates frequency response plots (magnitude and phase responses) of a transfer function of the first configuration (FIG. 1A) when connected to a capacitive load measured at the output port, as a function of frequency of the injected second input signal, according to one embodiment.

Referring to the equivalent circuit representation of configuration 100 described with reference to FIG. 1C, gain and phase responses of the transfer functions G(s) (equation 4) and G2(s) (equation 5) for predefined component values of R2', C2, R3, and C3 are as shown in FIG. 5. In the illustration of FIG. 5, for component values of R2'=20 ohms, C2=5 μF, R3=0.3 ohms, and C3=0.1 μF, magnitude response 510-a and phase response 520-a correspond to the transfer function G(s), and magnitude response 510-b and phase response 520-b correspond to the transfer function G2(s).

Frequency F1 corresponds to a first pole for both transfer functions G(s) and G2(s) formed by components R2' and C3. Frequency F2 corresponds to a zero for transfer function G(s) as a result of components R3 and C3. Frequency F3 corresponds to a second pole for transfer function G(s) due to components R2' and C2. The zero at frequency F2 limits the index of discrimination between the output signal amplitude range with and without the load. This is because, owing to the zero formed by R3 and C3, no additional signal attenuation can be achieved by increasing the frequency of the second input signal V2 beyond frequency F2. In some embodiments, a frequency of the second input signal V2 is selected to be suitably greater than frequency F1 to provide the desired attenuation in the presence of the load (C3) and to achieve the desired index of discrimination. The frequency of the second input signal V2 is optionally less than frequency F2 since increasing the frequency beyond F2 does not result in an improvement in the index of discrimination. For example, a frequency of 1 MHz (greater than F1) may be selected, which would be suitably attenuated by a load capacitance C3 to provide a desired difference in amplitude range with and without C3.

FIG. 6 illustrates frequency response plots (magnitude and phase responses) of a transfer function of the second configuration (FIG. 2A) when connected to a capacitive load, as a function of frequency of the injected second input signal V2, according to one embodiment.

Referring to the equivalent circuit representation of configuration 200 described with reference to FIG. 2B, gain and phase responses of the transfer functions G3(s) (equations 6 and 7) for predefined component values of R2, C2, C5, R3, and C3 are as shown in FIG. 6. In the illustration of FIG. 6, for component values of R2=2 kohms, C2=5 μF, C5=0.1 μF, R3=0.3 ohms, and C3=0.1 μF, magnitude response 610 and phase response 620 correspond to the transfer function G3(s).

Frequency F1 corresponds to a first pole for the transfer function G3(s) formed by components R2 and C3. Frequency F2 corresponds to a zero for transfer function G3(s) as a result of components R3 and C3. Frequency F3 corresponds to a second pole for transfer function G(s) due to components R2' and C2. The zero at frequency F2 limits the index of discrimination between the output signal amplitude range that can be achieved with and without the load being connected.

But, in comparison to the frequency responses 510-a and 510-b of FIG. 5, the lower frequency pole (F1) occurs at a lower frequency for configuration 200 than for configuration 100 for the same source resistance (R2). This is in part due to the reflected source resistance (R2'=R2/k$^2$ as described in equation 2) of the first configuration 100 being lower than the actual source resistance (R2) of the second configuration 200. Therefore, in the second configuration, a greater range of frequencies or a lower frequency of the second input signal V2 can be used to provide a suitable index of discrimination as compared to the first configuration 100, for the same source resistance R2.

FIGS. 7A and 7B illustrate alternative representations of frequency responses (magnitude and phase responses) of a transfer function of the second configuration (FIG. 2A) with and without a load, respectively, according to another embodiment.

Referring to the circuit representation of configuration 200 described with reference to FIG. 2A, without neglecting the inductor L1 in the analysis of the circuit transfer function, gain and phase responses of the transfer functions G4(s) computed for the circuit of FIG. 2A for the output signal Vout with respect to the second input (V2) with L1 considered (equation 8) for predefined component values of R2, C2, C5, R3, L1, and C3, are as shown in FIGS. 7A-7B. In the illustration of FIG. 7A, for component values of R2=2 kohms, C2=5 μF, C5=0.1 pF, R3=0.3 ohms, and L1=10 uH, magnitude response 710-a and phase response 720-a correspond to the transfer function G4(s) for a load capacitance of C3=0.1 μF. In the illustration of FIG. 7B, for the same component values of R2, C2, C5, R3, and L1, magnitude response 710-b and phase response 720-b correspond to the transfer function G4(s) for a negligible load capacitance of C3≈0 F.

As seen from a comparison of the magnitude responses 710-a and 710-b, the circuit of FIG. 2A operates as a resonant circuit, characterized by a resonant frequency ($\omega_0$), bandwidth ($\Delta\omega$), and gain. In the configuration of FIG. 2A, the resonant frequency ($\omega_0$) and bandwidth ($\Delta\omega$) of the resonant circuit vary inversely with the capacitance (C3); the gain of the resonant circuit relates directly with the capacitance (C3). Thus, for a higher load capacitance value, the resonant frequency ($\omega_0$) and bandwidth ($\Delta\omega$) of response 710-a of FIG. 7A are lower than those of response 710-b of FIG. 7B. On the other hand, the gain of response 710-a of FIG. 7A is greater than that of response 710-b of FIG. 7B at a frequency of 1 MHz of the second input signal V2.

Based on the different characteristics of the frequency responses of the circuit with and without the load capacitance, a suitable frequency of the injected second input signal may be selected to achieve a desired index of discrimination between the measured output signal with and without the load. For example, in the illustration of FIGS. 7A and 7B, the gain of the circuit varies between approximately −60 dB (FIG. 7A) with the load and −30 dB without the load (FIG. 7B).

Upon reading this disclosure, those of skill in the art will appreciate still additional alternative designs for the load detection apparatus. Thus, while particular embodiments and applications of the present disclosure have been illustrated and described, it is to be understood that the disclosure is not limited to the precise construction and components disclosed herein and that various modifications, changes and variations which will be apparent to those skilled in the art may be made in the arrangement, operation and details of the methods and apparatuses of the present disclosure disclosed herein without departing from the spirit and scope of the disclosure as defined in the appended claims.

What is claimed is:

1. An apparatus comprising:
an output port to be connected to a load;
a first input port to receive a first input signal;
a second input port coupled between the first input port and the output port, the second input port to receive a second input signal;
a coupling circuit to couple the second input signal to the output port;
a frequency isolation circuit coupled between the first input port and the second input port, the frequency isolation circuit having a frequency response to propagate the first input signal to the output port but prevent the second input signal from propagating to the first input port; and
a detection circuit to detect whether the load is present or absent at the output port by determining a voltage of an output signal at the output port, the detection circuit detecting that the load is absent at the output port responsive to determining that an amplitude of the voltage is within a first amplitude range and detecting that the load is present at the output port responsive to determining that the amplitude of the voltage is within a second amplitude range lower than the first amplitude range.

2. The apparatus of claim 1, wherein the coupling circuit includes a transformer, the second input port coupled to a primary side of the transformer, the first input port and the output port coupled to a secondary side of the transformer.

3. The apparatus of claim 1, wherein the frequency isolation circuit is an inductor coupled to the second input port via the coupling circuit.

4. The apparatus of claim 1, wherein the first amplitude range is between three and ten times greater than the second amplitude range.

5. The apparatus of claim 1, wherein the first input signal is substantially a DC signal, and the second input signal has a frequency not less than 1 MHz.

6. The apparatus of claim 1, wherein the second input signal is a sinusoidal signal having a frequency between 500 kHz and 5 MHz.

7. The apparatus of claim 1, wherein the detection circuit further determines a current of the output signal at the output port and a phase relationship between the voltage and the current of the output signal.

8. The apparatus of claim 1, wherein the first input signal is a regulated output voltage of a power supply circuit.

9. The apparatus of claim 1, wherein the coupling circuit includes a capacitor coupling the second input port to the output port.

10. The apparatus of claim 2, wherein the frequency isolation circuit includes an inductive element of the transformer.

11. The apparatus of claim 1, wherein the second input signal is a bandlimited signal having a plurality of frequencies between 500 kHz and 5 MHz.

12. The apparatus of claim 11, wherein the detection circuit further determines amplitude ranges for each of the plurality of frequencies of the second input signal.

13. A method comprising:
receiving a first input signal at a first input port;
injecting a second input signal at a second input port, the second input port coupled between the first input port and an output port, wherein the second input signal is coupled to the output port by a coupling circuit and is prevented from propagating to the first input port by a frequency isolation circuit;
detecting a voltage of an output signal at the output port responsive to the injected second input signal; and
comparing an amplitude of the voltage to a threshold amplitude range;
responsive to the amplitude of the voltage being lower than the threshold amplitude range, determining that a load device is connected at the output port; and
responsive to the amplitude of the voltage being within the threshold amplitude range, determining that a load device is not connected at the output port,
wherein the frequency isolation circuit is coupled between the first input port and the second input port, and has a frequency response to propagate the first input signal to the output port.

14. The method of claim 13, further comprising:
detecting a current of the output signal at the output port responsive to the injected second input signal;
determining a phase relationship between the current and the voltage of the output signal at the output port; and
determining characteristics of the load device based on the phase relationship.

15. The method of claim 13, wherein the second input signal comprises a first and a second frequency, the method further comprising:
determining a first amplitude range of the output signal for the first frequency and a second amplitude range of the output signal for the second frequency;
comparing the first amplitude range with a first reference to obtain a first measure of attenuation and the second amplitude range with a second reference to obtain a second measure of attenuation; and
determining characteristics of the load device based on a comparison of the first and second measures of attenuation.

16. An apparatus comprising:
an output port to be connected to a load;
a first input port to receive a first input signal;
a second input port coupled between the first input port and the output port, the second input port to receive a second input signal;
a coupling circuit to couple the second input signal to the output port;
a frequency isolation circuit coupled between the first input port and the second input port, the frequency isolation circuit having a frequency response to propagate the first input signal to the output port but prevent the second input signal from propagating to the first input port; and
a detection circuit to determine a voltage of an output signal at the output port, the output signal having a first amplitude range with a load absent at the output port and having a second amplitude range lower than the first amplitude range with the load present at the output port,
wherein the coupling circuit includes a transformer, the second input port coupled to a primary side of the transformer, the first input port and the output port coupled to a secondary side of the transformer.

17. An apparatus comprising:
an output port to be connected to a load;
a first input port to receive a first input signal;
a second input port coupled between the first input port and the output port, the second input port to receive a second input signal;
a coupling circuit to couple the second input signal to the output port;
a frequency isolation circuit coupled between the first input port and the second input port, the frequency isolation circuit having a frequency response to propagate the first input signal to the output port but prevent the second input signal from propagating to the first input port; and
a detection circuit to
determine a voltage of an output signal at the output port, the output signal having a first amplitude range with a load absent at the output port and having a second amplitude range lower than the first amplitude range with the load present at the output port, and
determine a current of the output signal at the output port and a phase relationship between the voltage and the current of the output signal.

* * * * *